United States Patent [19]

Takemura et al.

[11] Patent Number: 4,782,029

[45] Date of Patent: Nov. 1, 1988

[54] METHOD OF GETTERING SEMICONDUCTOR WAFERS WITH AN EXCIMER LASER BEAM

[75] Inventors: Kazumi Takemura; Fumitoshi Toyokawa; Masao Mikami, all of Tokyo, Japan

[73] Assignee: NEC Corporation, Tokyo, Japan

[21] Appl. No.: 68,125

[22] Filed: Jun. 30, 1987

[30] Foreign Application Priority Data

| Jun. 30, 1986 | [JP] | Japan | 61-154372 |
| Oct. 24, 1986 | [JP] | Japan | 61-254309 |
| Nov. 11, 1986 | [JP] | Japan | 61-269191 |
| Nov. 11, 1986 | [JP] | Japan | 61-269192 |
| Apr. 20, 1987 | [JP] | Japan | 62-97769 |

[51] Int. Cl.$^4$ .......................................... H01L 21/265
[52] U.S. Cl. .................................... 437/011; 437/019; 437/171
[58] Field of Search .......................... 437/011, 019, 071

[56] References Cited

U.S. PATENT DOCUMENTS

| 4,131,487 | 12/1978 | Pearce et al. | 437/11 |
| 4,319,119 | 3/1982 | Runge | 437/11 |
| 4,370,175 | 1/1983 | Levatter | 437/19 |
| 4,415,373 | 11/1983 | Pressley | 437/11 |
| 4,539,050 | 9/1985 | Kramler et al. | 437/11 |
| 4,668,304 | 5/1987 | Schachameyer et al. | 427/53.1 |

OTHER PUBLICATIONS

Narayan et al, Jour. Appl. Phys. 55 (1984) 1125.
Young et al, IEEE-Electron Device Letts., EDL-3, Oct. 1982, p. 280.
Fowler et al, IBM-TDB, 22 1980, p. 5473.

*Primary Examiner*—Upendra Roy
*Attorney, Agent, or Firm*—Helfgott & Karas

[57] ABSTRACT

A gettering method has a step in which the back surface of a semiconductor substrate having the upper surface on which semiconductor device elements is to be formed, with a laser beam having a wavelength of 150 to 400 nm to introduce strain fields onto the back surface of the substrate. The energy density of the laser beam is from 0.5 to 10 J/cm$^2$, and the irradiation pitch of the laser is 40 to 1500 μm. The laser irradiation may be effected under the condition where an oxide film or a nitride film is formed on the back surface of the semiconductor substrate, or after the back surface of the semiconductor substrate is blasted with fine particles of silica or the like.

6 Claims, 4 Drawing Sheets

METHOD OF GETTERING SEMICONDUCTOR WAFERS WITH AN EXCIMER LASER BEAM

BACKGROUND OF THE INVENTION

1. Field of the Invention:

The present invention relates to gettering semiconductor wafers by directing a laser beam and more specifically, to gettering a silicon wafer by introducing strain fields in the back surface thereof with a laser directed thereon to induce crystalline defects which trap contaminants such as heavy metals.

2. Description of the Related Art:

Strain fields existing on the back surface of a semiconductor substrate induce crystalline defects such as stacking faults and dislocations in a heat-treatment. Contaminants such as heavy metals at the upper surface of the substrate where various semiconductor elements are to be formed are trapped by the crystalline defects during the same heat-treatment by the so-called gettering effect. As a result, production yields of semiconductor devices are enhanced. This gettering technique has been widely used in manufacture of semiconductor devices.

It has been proposed in the U.S. Pat. No. 4,131,487 and in Journal of the Electrochemical Society, Vol. 128, No. 9, 1981, pp. 1975–1980 to use an Nd:YAG laser beam for introducing strain fields in the back surface of a semiconductor wafer. The back surface of the wafer is irradiated with a laser beam to melt a surface layer of the back surface which is then solidified to generate crystalline defects such as dislocation loops and getter heavy metals and the like. Strain fields can be introduced in the back surface of the wafer either before or during transistor elements are formed in the upper surface of the wafer.

The present inventors have found disadvantages of the proposed laser gettering method. The laser beam emitted from the Nd:YAG laser has a wavelength of 1.06 μm which lies in infrared region at which the semiconductor substrate, particuarly, the silicon substrate, has a small absorption coefficient. In order to introduce the distortion field in the back surface of the semiconductor substrate to the extent that it may exhibit gettering ability, the energy density of the Nd:YAG laser must be increased. When irradiated with the Nd:YAG laser beam having such a high energy density, however, the scars of melt are nonuniformly and deeply formed in the semiconductor substrate to depths of as great as 50 μm or more, causing the semiconductor substrate to be warped remarkably. With heat-treatments being repeated in the process of manufacturing semiconductor devices, furthermore, cracks often develop in the semiconductor substrate by the nonuniformly and deeply formed scars of melt. Furthermore, the Nd:YAG laser has such a small beam spot that the semiconductor wafer must be irradiated over an extended period of time for introducing distortion field throughout the whole back surface of the semiconductor wafer, resulting in a poor productivity.

SUMMARY OF THE INVENTION

It is, therefore, an object of the present invention to provide a method of gettering a semiconductor wafer by directing a laser beam thereon without causing the wafer to be warped or cracked.

It is another object of the present invention to provide a method of gettering a semiconductor wafer by a laser beam in a high productivity.

The present invention is featured by the use of a laser beam having a wavelength of 150 nm to 400 nm in the ultraviolet region. The back surface of a semiconductor wafer is irradiated by a laser beam having a wavelength in the ultraviolet region before, during or after circuit elements are formed in the upper surface of the wafer, followed by a heat-treatment of the wafer. The heat-treatment may be omitted when the wafer is heated in a process of forming circuit elements after the laser irradiation.

Since a semiconductor wafer has a large absorption coefficient at the ultraviolet region, the laser beam of the ultraviolet region irradiated on the semiconductor substrate acts only on a shallow region at the back surface of the wafer. Therefore, the back surface is only shallowly melted and then solidified, so that the wafer is not warped or is not cracked.

The excimer laser can be used as a laser having a wavelength in the ultraviolet region. With the excimer laser, a large beam spot with a high energy density can be relatively easily obtained, and it is possible to introduce strain fields throughout the whole back surface of the semiconductor wafer within a short period of time.

Since there is no need of protecting the upper surface of the wafer, it is allowed to irradiate the back surface with the excimer laser beam during or after the circuit elements are formed in the wafer, increasing the degree of freedom of the process of manufacturing semiconductor devices.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1A:
FIGS. 1(a) to 1(c) are sectional views illustrating the principal steps according to a first embodiment of the present invention.
Figure 1B:
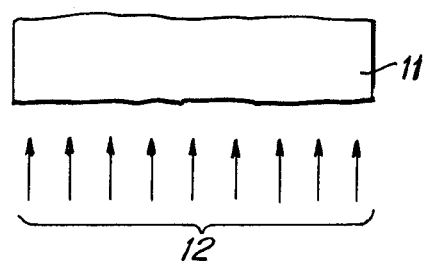
Figure 1C:
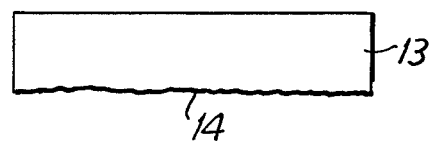

Referring to FIG. 1(a), a silicon wafer or substrate 11 is sliced from an ingot and its surfaces are roughly polished. According to the gettering method in a first embodiment of the invention, excimer laser beams 12 are directed on the roughly polished back surface of the wafer 11 as shown in FIG. 1(b). Thereafter an upper surface of the wafer 11 is polished as finely as a mirror surface to obtain a semiconductor wafer 13 having a upper, mirror surface and a damaged back surface as shown in FIG. 1(c). The wavelength of the excimer laser beams 12 lies in the ultraviolet range and the silicon wafer 11 has a small transmissivity, and the energy of the laser beams is almost all absorbed near the back surface of the silicon substrate 11. Therefore, only a shallow portion of the back surface is melted, which is then rapidly solidified and scars of melt 14 are formed at the back surface which give rise to crystalline defects and induce gettering.

Circuit elements such as transistors, diodes, capacitors and resistors are then formed on the upper surface of the silicon wafer 13. During the formation of the circuit elements, the wafer 13 is heated at 800° to 1200° C. in, for example, impurity diffusion step. Due to this heat treatment, crystalline defects such as stacking faults and dislocations are generated from the scars of melt 14. Contaminants such as heavy metals are gettered by these defects, and the gettering effect is achieved. The back surface of the wafer 11 may be irradiated with the beam of excimer laser to form scars of melt 14, after the elements are formed in the upper surface of the wafer. In this case, however, the heat treatment of the wafer at 800° C. to 1200° C. must be effected in a subsequent step to achieve the gettering effect.

The excimer laser beam does not penetrate deep into the silicon wafer, and the scars of melt 14 are formed to a depth smaller than 10 μm without causing the wafer to be warped or cracked. The excimer laser has a larger beam size than that of the Nd:YAG laser, and makes it possible to have the back surface of the wafer exhibit uniform gettering effect over a wide area with a reduced number of times of scanning.

EXAMPLE 1-1

The exposed back surface of an n-type silicon (100) substrate 11 having a resistivity of 10 ohm-cm was irradiated in a nitrogen atmosphere with pulses of a KrF excimer laser beam 12 having a wavelength of 249 nm under the conditions of a repetition frequency of 100 Hz and an irradiation pitch of 500 μm. The energy density of the laser beam was changed over a range of 0.5 to 30 J/cm$^2$, and the depth of the scars of melt 14 was changed accordingly from 1 μm to 30 μm depending upon the energy density of the laser beam. When the energy density of the laser beam was from 0.5 to 10 J/cm$^2$, the depth of the scars of melt 14 was not greater than 10 μm and the silicon substrate 13 was not warped or cracked even after the heat treatment in a subsequent step. When the energy density of the laser beam was lower than 0.5 J/cm$^2$, no scar of melt was developed on the back surface of the silicon substrate 13. When the energy density of the laser beam was from 10 to 30 J/cm$^2$, the depth of the scars of melt 14 was from 10 to 30 μm, and the silicon substrate 13 was warped little in the subsequent step of heat treatment and cracks were generated in the silicon substrate 13 at an increased rate. The silicon substrate 13 irradiated with the pulsed beams of the KrF excimer laser 12 with an energy density of 0.5 to 10 J/cm$^2$ was oxidized at 1150° C. by burning hydrogen for two hours. There were developed crystalline defects consisting of stacking faults and dislocations along the scars of melt 14 at a density of about 10$^7$/cm$^2$ or higher. The density of these crystalline defects remained in a number of about 10$^5$ to 10$^6$/cm$^2$ which was sufficient to obtain the gettering effect, even after the substrate was heated in a nitrogen atmosphere at 1200° C. for 8 hours.

Then, a MOS capacitor having a gate film, as a dielectric, of silicon oxide having 1-mm square area and 300 angstrom thickness was formed on the upper surface of the silicon substrate 13 that had been irradiated with the pulsed beams of KrF excimer laser with an energy density of 0.5 to 10 J/cm$^2$. Measurement of decay of capacitance of the MOS capacitor by the C-t method indicated that the carrier life times were from 1.0 to 3.0 msec, which were greater than the carrier life times of 0.8 to 1.3 msec of the conventional substrate having the back surface on which fine particles of silica were blasted. Furthermore, a breakdown voltage of the silicon oxide gate films of the MOS capacitor was measured. A voltage was applied continuously to the silicon oxide film, and the voltage at which the leakage current of the silicon oxide film reached 0.1 mA/cm$^2$ was determined to be a breakdown voltage. The silicon oxide films of a plurality of MOS capacitors were measured for obtaining the breakdown voltages. As a result, 70 to 90% of the MOS capacitors exhibited the breakdown voltage of greater than 9 MV/cm. This is superior over the corresponding value of 40 to 70% of MOS capacitors formed on a conventional substrate. It will therefore, be understood that the present invention has excellent gettering effect.

In the foregoing was described the case where the n-type silicon (100) substrate was used as the silicon substrate 11. The same results were obtained even where p-type silicon (100) substrate having a resistivity of 12 ohm-cm was used. Furthermore, the same results were obtained with an ArF excimer laser having a wavelength of 193 nm or an XeCl excimer laser having a wavelength of 308 nm, instead of the KrF excimer laser 12. The same results were obtained when the substrates were irradiated with an excimer laser in the dry air.

EXAMPLE 1-2

Figure 2:
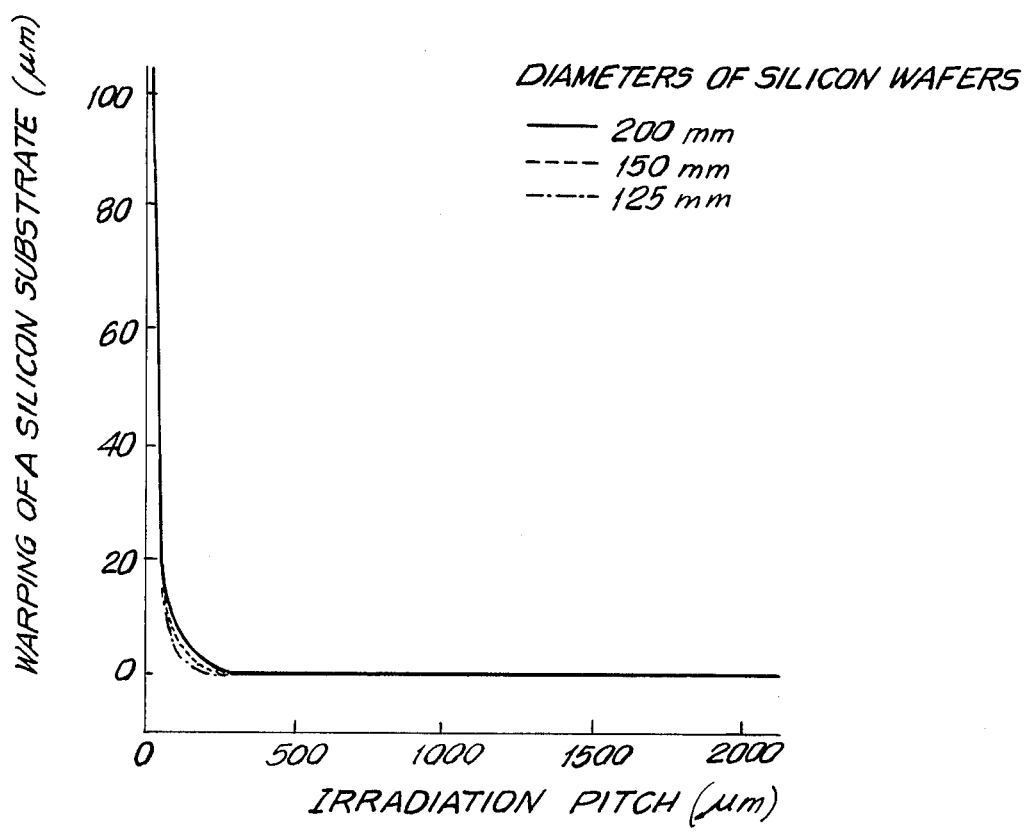
FIG. 2 is a diagram of a relationship between the warping of a silicon wafer and an irradiation pitch of a laser.

Roughly polished back surfaces of silicon substrates 11 having diameters of 125 mm, 150 mm and 200 mm were irradiated with a pulsed beam converged into a square shape of 20 μm × 50 mm of the KrF excimer laser 12 under the conditions of energy densities of 5 J/cm$^2$ and 10 J/cm$^2$, repetition frequency of 100 Hz, sweep speed of 2.5 mm/sec to 200 mm/sec on the silicon substrate. As a result, the substrates were irradiated with the excimer laser pulses in the form of a belt with an irradiation pitch of 25 to 2000 μm. The irradiation was effected in a nitrogen atmoshpere to scan the whole back surface of the silicon substrate 11. FIG. 2 shows a relationship between the warping of the silicon substrate caused by the irradiation and the irradiation pitch. The same results were obtained in both cases where the energy density of the laser was 5 J/cm$^2$ and 10 J/cm$^2$. When the irradiation pitch was narrower than 40 μm, the warping exceeded 25 μm to adversely affect the formation of circuit elements in the subsequent steps. In the step of heat treatment, furthermore, crystalline defects such as thermal slips that adversely affect the characteristics of the circuit elements were generated in large amounts due to the thermal stress. Next, the substrate irradiated with the excimer laser beam was oxidized at 1140° C. for two hours in a wet oxygen atmosphere, and was then immersed in a solution consisting of a 49 wt % HF solution and a 33 wt % H$_2$CrO$_3$ solution at a ratio of 1 to 1, in order to observe the pits in the upper surface of the substrate. No pit was found when the irradiation pitch was smaller than 1500 μm. When the irradiation pitch was greater than 1500 μm, however, pits were generated, which revealed that the gettering effect was not obtained sufficiently. The density of crystalline defects in the back surface of the substrate, breakdown voltage of the MOS capacitors and carrier life times were examined by the same methods as those mentioned in Example 1-1. When the irradiation pitch was from 40 to 1500 μm and the energy density of laser beam was 5 J/cm$^2$, the density of dislocations was 10$^7$/cm$^2$, the density of stacking faults was 10$^5$/cm$^2$, 95% of the MOS capacitors exhibited the breakdown voltage of greater than 9 MV/cm, and the carrier life time was 2×10$^{-3}$ sec. When the energy density of the excimer laser beam was 10 J/cm$^2$, the density of dislocations was 10$^7$ to 10$^8$/cm$^2$, the density of stacking faults was 10$^5$/cm$^2$, 90% of the MOS capacitors exhibited the breakdown voltage of higher than 9 MV/cm in the silicon oxide film thereof, and the carrier life time was 3×10$^{-3}$ sec. In the foregoing was described the case where the KrF excimer laser was used. The same results were also obtained when an XeCl excimer laser was employed.

EXAMPLE 1-3

Referring to FIGS. 3(a) to 3(f), an n-channel MOSFET was formed in a p-type (100) silicon semiconductor substrate 305 having a resistivity of 12 ohm-cm in accordance with the present invention.

Figure 3A:
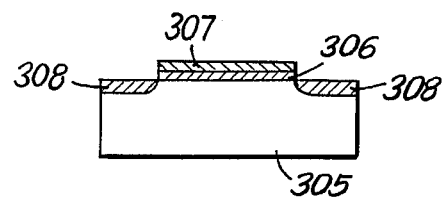
FIGS. 3(a) to 3(f) are sectional views illustrating the steps for manufacturing a MOS field-effect transistor according to the first embodiment of the present invention.
Figure 3B:
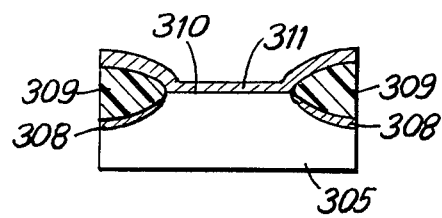
Figure 3C:
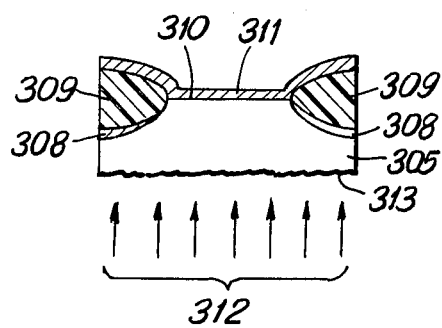
Figure 3D:
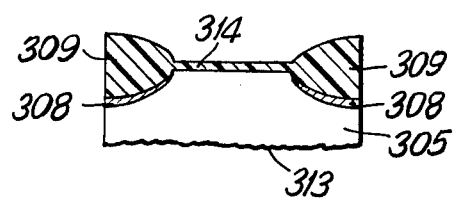
Figure 3E:
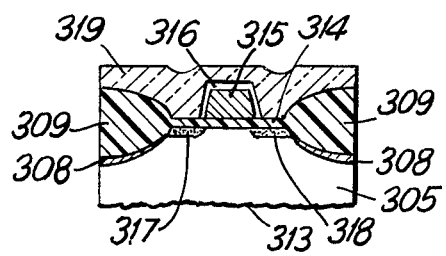
Figure 3F:
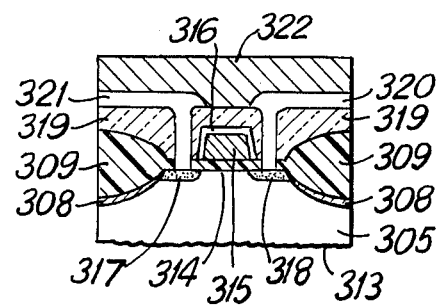

In forming the n-channel MOSFET in the upper surface of the semiconductor substrate 305, a silicon oxide film 306 and a silicon nitride film 307 were formed on the surface of a p-type silicon substrate 305, and were then removed leaving a predetermined pattern as shown in FIG. 3(a). Then, p+-type impurity regions 308 was formed to constitute a channel stopper for element isolation. With reference to FIG. 3(b), the surface of the p+-type impurity regions 308 was selectively oxidized to form thick silicon oxide films 309 for element isolation, followed by the removal of the silicon nitride film 307 and the silicon oxide film 306. The oxidation was effected again to form a silicon oxide film 311 on the surface 310 of the p-type silicon substrate where a MOS transistor will be formed. The silicon oxide film 311 contained impurities due to contamination during these steps. After the silicon oxide film 311 was formed, the back surface of the p-type silicon substrate 305 was irradiated with the pulsed beam of an XeCl excimer laser 312 (energy density of 0.5 to 10 J/cm$^2$, repetition frequency of 100 Hz, and wavelength of 308 nm) in a nitrogen atmosphere with an irradiation pitch of 300 μm as shown in FIG. 3(c) to give damage 313 of a pattern of the scanned laser beam pulses onto the back surface. Thereafter, the silicon oxide film 311 was removed, and the oxidation was effected again at 900° C. to form a gate oxide 314 as shown in FIG. 3(d). Then, as shown in FIG. 3(e), there were formed a polycrystalline silicon gate electrode 315, an oxide film 316 covering the silicon gate, a source region 317, a drain region 318, and an insulating film 319. The source region 317 and the drain region 318 having impurity concentration of 5×10$^{19}$/cm$^3$ were formed by implanting n-type impurities and activating at 1000° C. Finally, as shown in FIG. 3(f), there were formed wirings 320 and 321, and an insulating cover 322 to complete the n-channel MOSFET.

When the process of Example 1-3 was adapted in manufacture of n-channel MOSFET's for a dynamic random access memory, the yields of good devices was improved by 17 to 20% compared with the conventional process for manufacturing a dynamic random access memory in which gettering was done with a conventionally practical method of blasting fine particles of silica or the like on the back surface of the substrate to give damage thereto. The yields of good devices were similarly improved where an KrF excimer laser having a wavelength of 249 nm was used.

According to a second embodiment of the present invention, the back surface of a silicon wafer to be irradiated is coated with a silicon oxide film having a thickness of about 500 to 5000 angstroms, or a silicon nitride film having a thickness of 500 to 2000 angstroms, or a laminated layer consisting of a silicon oxide film having a thickness of about 500 to 5000 angstroms and a silicon nitride film having a thickness of about 500 to 2000 angstroms. Thereafter, the coated back surface of the silicon substrate was irradiated with a pulsed beam of an excimer laser having a wavelength that lies in the ultraviolet region, and contaminants were gettered by the dislocations and stacking faults generated from the strain field of the scars of melt formed in the back surface of the silicon wafer. When irradiated with the beam of the excimer laser, the oxide film or the nitride film on the back surface was melted together with the silicon wafer. At the time of solidification, therefore, a large amount of oxygen or nitrogen was taken into the back surface of the silicon wafer to form Si—O or Si—N bonds therein that contributed to secondarily forming the strain field and the crystalline defects. The strain field and the crystalline defects could be stably maintained for an extended period of time even after the heat treatment had been effected in the process of manufacturing the devices.

EXAMPLE 2-1

A silicon oxide film having a thickness of 1000 angstroms was formed on the whole surfaces of a silicon substrate that was roughly polished. The whole back surface of the substrate was irradiated with a pulsed beam of the KrF excimer laser (wavelength 249 nm) that lied in the ultraviolet region, in order to form a gettering layer having strain field and crystalline defects. The irradiation of the excimer laser was effected at a repetition frequency of 90 Hz with an energy density of 8 J/cm$^2$. It took 10 seconds to complete irradiation of the whole back surface of a 6-inch diameter silicon wafer. Thereafter, the silicon oxide film was removed from the surface, and the upper surface where no gettering layer had been formed was polished as finely as a mirror surface. The silicon wafer manufactured according to the above-described method was oxidized at 1100° C. for two hours in burning hydrogen and was subjected to the Sirtl etching. Pits caused by oxygen precipitate and dislocations were observed at a density of about 10$^6$ to 10$^7$/cm$^2$, stacking faults were observed at a density of 10$^5$ to 10$^6$/cm$^2$, and the strain field and the crystalline defects were confirmed to have been induced to such a degree that was sufficient to trap contaminating impurities by gettering.

EXAMPLE 2-2

A silicon oxide film was formed on the whole surfaces of a roughly polished silicon substrate, and a silicon nitride film was formed thereon at a thickness of 500 angstroms. The coated back surface of the substrate was irradiated with a pulsed beam of the XeCl excimer laser (wavelength 308 nm) that lied in the ultraviolet region in order to form a gettering layer in which strain field and crystalline defects were induced. The laser irradiation was effected at an repetition frequency of 110 Hz and an energy density of 5 J/cm$^2$. It required 10 seconds that the back surface of a 6-inch silicon substrate was wholly scanned by the laser beam. Thereafter, the silicon nitride film and the silicon oxide film were removed, and the upper surface was polished as finely as a mirror surface, thereby to enable circuit elements to be formed therein. The thus manufactured silicon substrate was oxidized at 1100° C. for two hours in burning hydrogen and was subjected to the Sirtl etching. Pits caused by oxygen and nitrogen precipitates and dislocations were observed at a density of about 10$^6$ to 10$^7$/cm$^2$, the stacking faults were observed at a density of 10$^5$ to 10$^6$/cm$^2$, and the strain field and the crystalline defects were confirmed to have been induced to a degree that was sufficient to trap contaminants by gettering. It was further attempted to irradiate the back surface coated only with a silicon nitride film with the XeCl excimer laser beam and the same results were obtained.

EXAMPLE 2-3

Figure 4A:
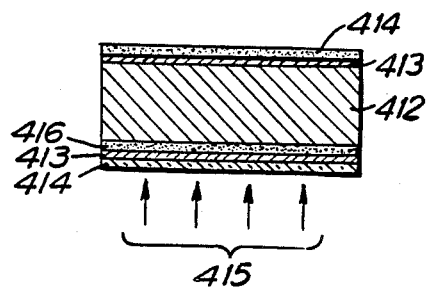
FIGS. 4(a) to 4(e) are sectional views illustrating the steps for manufacturing a MOS diode according to a second embodiment of the present invention.
Figure 4B:
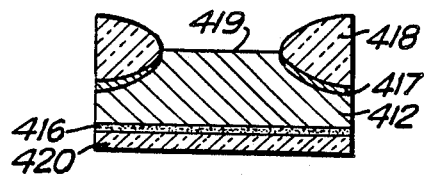
Figure 4C:
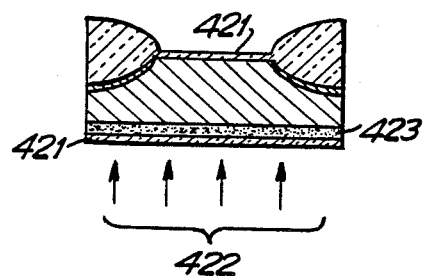
Figure 4D:
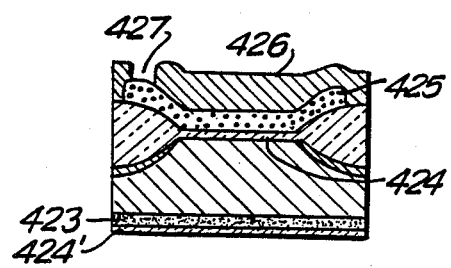
Figure 4E:
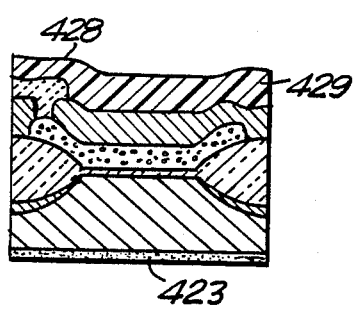

MOS capacitors were produced by using the present invention. As shown in FIG. 4(a), a silicon oxide film 413 having a thickness of 500 angstroms and a silicon nitride film 414 having a thickness of 1000 angstroms were formed on the upper mirror surface of a p-type (100) silicon substrate 412 having a resistivity of 10 ohm-cm, and on the roughly polished back surface having no strain. The roughly polished and coated back surface of the substrate 412 was irradiated with a pulsed beam 415 of the KrF excimer laser with an energy density of 8 J/cm$^2$ and an repetition frequency of 100 Hz in an nitrogen atmosphere maintaining an irradiation interval of 600 μm, in order to form a gettering layer 416. Then, the silicon nitride film 414 was removed except for element-forming regions 419 and a p$^+$-type region 417 that will serve as a channel stopper was formed on the portion of the upper surface of the substrate 412 from which the silicon nitride had been removed. Then a selective oxidation of the upper surface of the substrate 412 was performed at 1000° C. with the left silicon nitride film being used as a mask. As a result, a thick silicon oxide film 418 a field insulator for isolation was formed and the silicon nitride film 414. The silicon nitride film and the silicon oxide film 413 were removed from the element-forming region 419, as shown in FIG. 4(b). During the selective oxidation process, contaminants such as heavy metals were gettered by the gettering layer 416. When the silicon oxide film 418 was formed, a silicon oxide film 420 was also formed thickly on the back surface of the silicon substrate 412 and therefore the thickness of the gettering layer 416 decreased. As a result, the strain field was relaxed and the density of the crystalline defects decreased or the sizes of these defects were reduced. Then, as shown in FIG. 4(c), the oxide film 420 was removed from the back surface, and a silicon oxide film 421 of a thickness of as small as 200 angstroms was formed on the element-forming region 419 and on the back surface. The coated back surface was irradiated again with the pulsed beam 422 of the KrF excimer laser under the conditions of an energy density of 9 J/cm$^2$, repetition frequency of 100 Hz and an irradiation pitch of 600 μm in a nitrogen atmosphere in order to form a gettering layer 423 again. Then, as shown in FIG. 4(d), the silicon oxide film 421 was removed and a gate silicon oxide film 424 was formed at 900° C. A polycrystalline silicon electrode 425 was formed thereon at 800° C. and an insulating film 426 was deposited in which a contact hole 427 was formed. Contaminants such as heavy metals were gettered when the gate oxide film 424 and the polycrystalline silicon electrode 425 were being formed. When the gate silicon oxide film 424 was formed, a silicon oxide film 424' was also formed on the back surface. The gate silicon oxide film 424, however, was formed at a temperature as low as 900° C. having a thickness as thin as 200 angstroms. Therefore, the gettering layer 423 was worn out very little by the silicon oxide film 424'. Finally, as shown in FIG. 4(e), an aluminum wiring 428 was formed and was covered with an insulating cover film 429.

The MOS capacitors manufactured according to the above-described method were compared with MOS capacitors manufactured on the silicon substrate subjected to the conventionally practical gettering method of blasting fine particles such as silica or the like, with regard to their breakdown voltage characteristics of the gate silicon oxide films (200 angstroms thick). The number of the MOS capacitors having poor breakdown voltage was as small as 40% of that of the MOS capacitors obtained by the conventional gettering method. Moreover, the MOS capacitors obtained by the proposed gettering method of employing the Nd:YAG laser were compared with the MOS capacitors manufactured by the present invention in regard to a minority carrier life time by the C-t method. The MOS capacitors obtained by using the Nd:YAG laser exhibited the minotiry carrier life time of about 1×10$^{-3}$ seconds, whereas those of the present invention exhibited the minority carrier life time of 3×10$^{-3}$ seconds that was an improvement by about threefold.

According to a third embodiment of the present invention, strain is introduced to the back surface of the semiconductor substrate before laser irradiation. The back surface of the semiconductor substrate is mechanically damaged by blasting the back surface with fine particles of alumina (Al$_2$O$_3$) or silica (SiO$_2$), and thereafter irradiated with a beam of an excimer laser. The excimer laser irradiation is effected with an energy density of laser beam over a range of equal to or greater than 0.5 J/cm$^2$ but equal to or smaller than 10 J/cm$^2$, to melt the back surface and thereby to induce strain fields. After the strain fields are induced, the heat treatment is effected at 800° to 1200° C.

When the back surface of the semiconductor substrate that had been mechanically damaged by the sandblast method up to a depth of about 2 to 10 μm from the surface thereof was irradiated with an excimer laser beam of a wavelength that lied in the ultraviolet region, the scars irregularly melted up to a depth of about 0.1 to 1 μm, and a strain fields were stronger than when only the sandblast method was used. The strain fields were so strong that it was not reduced even having passed through the step of heat treatment in the process of forming circuit elements, and the gettering effect was exhibited sufficiently throughout the entire process for manufacturing the semiconductor device. Therefore, there was no need of introducing the strain again during the process of manufacturing the semiconductor device. Moreover, since the scars were melted in a shallow region that was about 0.1 to 1 μm deep from the surface thereof, the semiconductor substrate was not warped even when the strain field was intensified by the irradiation with a laser beam, and the plastic deformation did not take place.

EXAMPLE 3

Figure 5A:
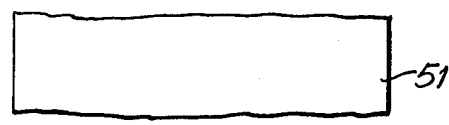
FIGS. 5(a) to 5(d) are sectional views illustrating the principal steps according to a third embodiment of the present invention.
Figure 5B:
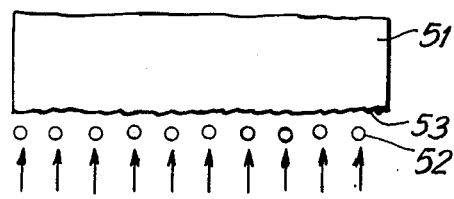
Figure 5C:
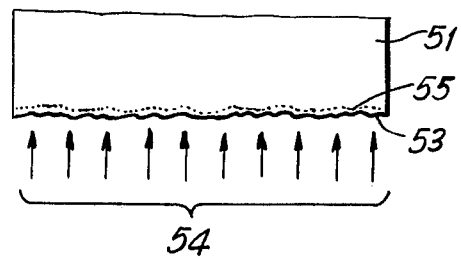

An example according to the third embodiment will now be described in conjunction with FIGS. 5(a) to 5(d). An n-type (100) silicon substrate 51 having a resistivity of 10 ohm-cm was cut out from the ingot and was roughly polished as shown in FIG. 5(a). With fine particles of $SiO_2$ having a particle size of about 0.1 μm, as shown in FIG. 5(b), was blasted on the back surface of the substrate 51 in order to give damage 53 deep by up to about 2 μm. After the step of rinsing, the back surface of the silicon substrate 51 was irradiated with a pulsed beam of KrF excimer laster 54 (wavelength 249 nm) with an energy density of 0.5 to 10 $J/cm^2$ to produce damages 53. The irradiated portions of the surface were melted nonuniformly to a depth of from 0.1 to 1 μm, and strain fields 55 were formed on the back surface of the silicon substrate (FIG. 5(c)). Thereafter, the upper surface was polished as finely as a mirror surface to obtain a silicon semiconductor substrate 56 (FIG. 5(d)).

The substrates obtained through the sand-blast method only, through the excimer laser irradiation only and through the above-mentioned method shown in FIG. 5 were oxidized at 1150° C. for two hours in burning hydrogen. In the silicon substrate of which the back surface had been strained by the sand-blast method only, there were developed stacking faults of the order of $10^4/cm^2$ and dislocations of the order of $10^7/cm^2$. In the substrate strained by the irradiation with the excimer laser beam only, the stacking faults of the order of $10^5/cm^2$ and dislocations of the order of $10^7/cm^2$ were developed. When the back surface was strained according to the present embodiment, however, the stacking faults of the order of $10^5/cm^2$ and dislocations of the order of about $10^7$ to $10^8/cm^2$ were developed.

The heat-treatment was further effected at 1200° C. for 8 hours in a nitrogen atmosphere. With the substrate strained by the sand-blast method only, the defects on the back surface all disappeared. With the substrate irradiated with the excimer laser beam only, the stacking faults reduced to a density of the order of $10^3/cm^2$ and dislocations reduced to a density of the order of $10^6/cm^2$. With the substrate of which the back surface was strained according to the present embodiment, the stacking faults were left of the order of $10^4/cm^2$ and dislocations were left of the order of $10^7/cm^2$.

By employing the method of introducing strain into the back surface according to this example, there was obtained strain fields that were very stable against the step of heat treatment.

Figure 5D:
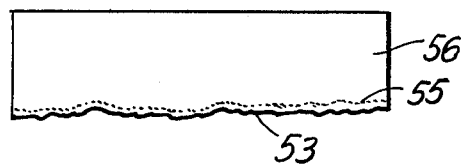

A 256k-bit random access memory was manufactured using the above-described silicon substrate 56 of FIG. 5(d) and the yield increased by about 20% compared with those manufactured using the substrates whose back surface had been strained by the conventional sand-blast method only.

Moreover, a p-type (100) silicon semiconductor substrate having a resistivity of 12 ohm-cm was obtained through the same steps as those described above, and a random access memory was manufactured using this silicon semiconductor substrate. The yield increased by 20 to 25% compared with those obtained using the conventional substrate whose back surface was strained by the sandblast method.

What is claimed is:

1. A gettering method comprising the steps of:
    irradiating the back surface of a semicondutor wafer with an excimer laser beam having a wavelength of 150 to 400 nm and an energy density of 0.5 to 10 $J/cm^2$ by scanning said back surface with a belt-like spot of said laser beam with an irradiation pitch of 40 to 1500 um; and
    thereafter performing a heat treatment of said semiconductor wafer for trapping contaminants of heavy metals in said semiconductor wafer at the back surface.

2. The gettering method as claimed in claim 1, further comprising the step of coating said back surface of said semiconductor wafer with at least one of a silicon oxide film and a silicon nitride fill before said step of irradiating the back surface.

3. The gettering method as claimed in claim 1, further comprising the step of blasting said back surface of said semiconductor wafer with fine particles of silica or alumina before said step of irradiating the back surface.

4. A method of maufacturing semiconductor devices comprising:
    a step of gettering contaminants of heavy metals in a semiconductor substrate at a back surface of said semiconductor substrate, said gettering step including irradiation of said back surface with an excimer laser beam having a wavelength of 150 to 400 nm and an energy density of 0.5 to 10 $J/cm^2$ to form strain fields in said back surface by repeatedly scanning said back surface in the form of belts with the pulse beam of the excimer laser with an irradiation pitch of 40 to 1500 um, said gettering step further including heat-treatment of said semiconductor substrate after said strain fields are formed; and
    a step of forming circuit elements in an upper surface region of said semiconductor substrate.

5. The method of manufacturing semiconductor devices as claimed in claim 4, wherein said step of forming circuit elements is effected before said gettering step.

6. The method of manufacturing semiconductor devices as claimed in claim 4, wherein said heat treatment is effected by thermally oxidizing said semiconductor substrate.

* * * * *